United States Patent

Comulada et al.

[11] Patent Number: 5,905,566
[45] Date of Patent: May 18, 1999

[54] LASER ABLATION TOP SURFACE REFERENCE CHUCK

[75] Inventors: Ralph R. Comulada, Rock Tavern; Bouwe W. Leenstra, Walden; Christopher L. Tessler, Campbell Hall, all of N.Y.

[73] Assignee: International Business Machines Corporation, Armonk, N.Y.

[21] Appl. No.: 08/838,588

[22] Filed: Apr. 10, 1997

[51] Int. Cl.[6] .................................................. H02N 13/00
[52] U.S. Cl. ................................... 355/73; 355/53; 430/5
[58] Field of Search .......................... 355/53, 73; 269/21; 430/5; 250/440.11, 442.11, 492.2, 491.1

[56] References Cited

U.S. PATENT DOCUMENTS

| | | |
|---|---|---|
| 4,412,133 | 10/1983 | Eckes et al. . |
| 4,724,222 | 2/1988 | Feldman . |
| 4,742,376 | 5/1988 | Phillips ........................................ 355/77 |
| 5,142,154 | 8/1992 | Komagata . |
| 5,152,707 | 10/1992 | Dougherty et al. . |
| 5,227,606 | 7/1993 | Weeks et al. . |
| 5,374,829 | 12/1994 | Sakamoto et al. . |
| 5,471,279 | 11/1995 | Takizawa . |

*Primary Examiner*—Daniel P. Malley
*Attorney, Agent, or Firm*—DeLio & Peterson, LLC; John J. Tomaszewski; Tiffany L. Townsend

[57] ABSTRACT

A reference chuck which is used with a leveling device for holding microelectronic substrates and other electronic component substrates for laser ablation and other exposure processes, the chuck comprising a frame body for supporting the substrate to be processed, clamping means at the periphery of the frame body for holding the substrate to the frame body and elastomeric means for urging the substrate mounted in the reference chuck against the clamping means. The undersides of the clamping means which contacts the upper surface of the substrate forms in its tightened position a clamping plane which clamping plane is parallel with an established plane of the lower surface of the chuck. The reference chuck provides a very low profile envelope for use with conventional leveling devices and the top surface of the substrate and the lower surface of the reference chuck are in parallel planes when the chuck is placed on the working surface of the leveling device.

10 Claims, 4 Drawing Sheets

LASER ABLATION TOP SURFACE REFERENCE CHUCK

BACKGROUND OF THE INVENTION

1. Field of the Invention

This invention relates to a chuck for holding microelectronic substrates and other electronic component substrates during the substrate manufacturing process, and, in particular, to a reference chuck for use with leveling devices, e.g., optical types, to enhance the effectiveness of the leveling device in the lithography or ablation steps of the manufacturing process.

2. Problem to be Solved

The manufacture of microelectronic substrates or other electronic component substrates require a number of steps to fabricate the desired circuit on the substrate. In the lithography steps of the manufacturing process lithography or ablation tools are used to ablate vias in the top surface metallurgy (TSM) e.g., polyimide coating, of in-process microelectronic substrate packages. Most lithography or ablation tools have a very limited travel with which to level a microelectronic substrate or other electronic component. This limited travel is normally due to the need to have a very rigid focus/leveling system. The terms microelectronic substrates and substrates will be used interchangeably herein and it should be kept in mind that the term "substrate" may apply to many types of microelectronic and electronic substrates.

As the metal loading in substrate packages increases and becomes more non-symmetric, it has become very difficult to make substrates where the top side metallurgy(TSM) and bottom side metallurgy (BSM) surfaces are parallel. This non-parallelism in combination with the limited travel of leveling systems is the main cause of leveling problems since the systems are not able to travel far enough to level BSM referenced substrates. When a substrate is processed in a laser ablation or other lithography tool, it generally has to be brought into the focus range and leveled or distortions in the exposed substrate result with the circuit being either nonfunctional or, at best, having less than optimum performance.

In general, leveling devices comprise a workstation consisting of parallel base plates which carry a substrate X-Y stage, a mask X-Y stage and supports a bridge assembly. The projection optics consist of a 1:1 telecentric lens. The tool is typically enclosed in an environmental chamber to maintain a Class 10 environment.

An ablation leveling system typically processes a single substrate at a time and the substrate is loaded onto the substrate chuck located on top of the substrate X-Y table. The X-Y table then positions the substrate under an optical auto focus assembly. Next, a Z axis slide and two leveling drives located in the substrate stage are used to focus and level the substrate. The tool also automatically loads a mask using an AHSM (Automatic Handling System Mask) onto the mask chuck located on top of the mask X-Y table. A pattern recognition system then locates the pre-align targets which are located at each corner of the substrate or mask. The targets are mapped and the locations recorded. The tool calculates a global X-Y translation and global rotation, which are used as a basis for finding the center of the substrate or mask. After substrate and mask prealignment, the mask is aligned to the substrate using the on axis alignment system. When the substrate and mask are aligned, data from a stored program are used to ablate the part. Multiple masks may be used. After ablation the part is unloaded.

Both the substrate and mask systems have a stage that positions the mask or substrate relative to the X-Y table and a chuck that holds the substrate or mask.

An auto focus and leveling system is designed to measure the distance between the auto focus sensor and the top surface of the substrate. This distance is controlled by drive actuators in the substrate stage. The Z-axis drive moves the substrate up and down to focus differing substrate thicknesses. The top leveling drives are used to compensate for any wedge in the substrate.

Automatic focus and automatic leveling are generally achieved by projecting a line of light on the substrate top surface and reading the reflected light with a dual photo detector. The light is typically emitted from a fiber optic light guide connected to a Hg arc lamp light source and filtered for 365 nm.

A common problem in the leveling step of the substrate manufacturing process is the large percentage of leveling errors due to distortion of the substrate. The substrate must be essentially flat or planar to achieve a high resolution pattern in the lithography process. This distortion is typically more than the amount of adjustment that the leveling cams of the leveling tool can perform. The cams are used to automatically raise or lower the substrate into the focus and level position. Some substrates pass the focus/level after several re-trys while others have to be completely removed from the tool, repositioned in the holding fixture, and then tried again. Each re-try where the substrate has to be removed and repositions takes time and this is of great impact to the through-put and delivery schedule of the substrate products.

One substrate fixturing method is to place the substrate onto a chuck which uses the bottom surface of the substrate at three points to establish a reference plane and then to bank the substrate into a fixed chuck corner relative to a set corner of the product. Some substrate products however are not very parallel between the top and bottom surfaces due to the density of the circuitry and, therefore, distortion of the exposed substrate at the focus/level alignment of the tool and/or multiple leveling procedures results.

Bearing in mind the problems and deficiencies of the prior art, it is therefore an object of the present invention to provide a reference chuck used with leveling devices to hold substrates in lithographic or ablation processes to increase the effectiveness of both the leveling process and the lithography or ablation process.

It is another object of the present invention to provide a method for making electronic components, e.g., microelectronic substrates, which are made by lithographic or ablation methods and in particular lithographic or ablation processes which use leveling devices.

A further object of the invention is to provide electronic components, e.g., microelectronic substrates, made using the method and apparatus of the invention.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a top surface reference chuck for holding microelectronic substrates or other electronic component substrates during laser ablation or other lithography exposure or ablation steps of the substrate manufacturing process which lithography or ablation steps use leveling devices to provide a level substrate surface for exposure or ablation, wherein the chuck establishes a substrate top surface and lower chuck surface having parallel planes by utilizing clamps which secure the substrate to the chuck and which clamp/substrate mating surfaces form a clamping plane with the clamping plane and lower chuck surface plane being in parallel planes and which lower chuck surface rests upon the leveling device and which lower chuck surface is planar and preferably in a three point comprised planar surface.

The top surface reference chuck comprises a plurality of resilient seats, e.g., three elastomeric seats situated preferably diametrically opposed at two sides of a rectangular chuck and are at the periphery of a central recess opening of the chuck upon which seats the lower surface of the substrate rests. The substrate is secured in the chuck with clamps, preferably three clamps and preferably positioned adjacent and proximate to the elastomeric seats, which clamps are positioned on the upper surface of the chuck and when the clamps are tightened, the substrate is squeezed against the resilient seats and the substrate urged against the underside clamping surface of the clamps. The underside clamping surfaces of the clamps when tightened form a parallel plane with the lower plane surface of the chuck. The parallel plane top surface of the substrate is established by the resilient seats urging the substrate against the underside clamping surface of the clamp.

The chuck has been found to eliminate many of the substrate leveling concerns at the laser ablation or other lithography step of the manufacturing process.

In a further aspect of the invention, a top surface reference chuck for holding a microelectronic substrate or other electronic component substrate to be exposed or ablated in a lithography process such as a laser ablation process comprises:

a frame body for supporting the substrate to be exposed, e.g., laser ablated, the frame body having a lower surface which is planar, preferably three point comprised planar, and which is positioned on a leveling device;

a plurality of movable clamping means secured at the periphery of the frame body for securing the substrate to the frame body, the underside clamping surfaces of the clamping means contacting the upper surface of the substrate and forming a clamping plane, with the plane of the lower surface of the frame body and clamping plane being parallel planes when the clamping means are tightened and providing a top surface of the substrate which is level in its secured position when the leveling device is level; and resilient means provided in the frame body, preferably at the periphery of the frame body and adjacent the clamps, for urging the secured and supported substrate against the clamping surface of the clamping means.

In preferred aspect of the invention, the frame body further comprises registration means on at least two sides of the frame body (at 90° for a rectangular frame body) for positioning the supported substrate on the frame body. The clamping means are movable upward and downward and sideways to allow top mounting on the substrate on the frame body. The clamping means preferably comprise a spring or other such resilient means to assist in moving the clamping means when the clamping means are loosened to mount or remove the substrate from the chuck. The frame body preferably has a central recess area in which the substrate is positioned. The frame body is typically rectangular and usually square such as a semiconductor chip with the recess being generally of the same configuration and a slightly larger size than the substrate to be mounted.

It is an important aspect of the invention that the frame body have a low profile thickness so as to be compatible with conventional leveling devices. To support the substrate or other electronic component substrates which are relatively heavy, it is important that the resilient means, preferably an elastomeric material, have the necessary resiliency to urge the substrate securely against the clamping surface of the clamp. It is preferred to employ elastomeric materials such as 60–70 Durometer Viton, nitrile or Neoprene in the recess area of the frame body for urging the supported substrate against the clamping means. The use of an elastomeric material allows the frame body to have a low profile thickness and to be compatible with conventional leveling devices. An elastomeric material is preferable because it has resiliency and is non-abrasive and makes minimal contact with the substrate.

It is another important aspect of the invention that the undersides of the clamps, which undersides mate with the top surface of the substrate being mounted (clamping surface), form in their tightened position a plane which is parallel with the plane of the lower surface of the reference chuck. In another preferred embodiment, the underside of the clamp which mates with the upper surface of the frame body are both on parallel planes so that the (1) lower surface of the chuck, (2) the upper surface of chuck, (3) the surface of the clamp which mates with the upper surface of the chuck and (4) the clamping surface are all in parallel planes. The plane of each surface may be defined by three connecting points on the surface. Thus, if the chuck has three clamps, a point on the underside of each clamp (clamping surface) when connected will be in a parallel plane with the plane of the lower chuck surface. The elastic memory of the compressed elastomer seats provide the necessary compressive force needed to urge the substrate upward and against the underside of the clamp.

In a further aspect of the invention, a method is provided for making electronic substrates by selectively exposing a circuit pattern on the surface of the electronic component substrate the method comprising the steps of:

mounting the substrate in a reference chuck comprising:
a frame body for supporting the substrate to be exposed, e.g., laser ablated, the frame body having a lower surface which is planar and preferably three point comprised planar and which is positioned on a leveling device;

a plurality of movable clamping means secured at the periphery of the frame body for securing the substrate to the frame body, the underside clamping surfaces of the clamping means contacting the upper surface of the substrate and forming a clamping plane with the plane of the lower surface of the frame body and the clamping plane formed by the underside surfaces of the clamping means being parallel planes when the clamping means are tightened, and providing a top surface of the substrate which is level in its secured position when the leveling device is level; and resilient means provided in the frame body, preferably at the periphery of the frame body and adjacent the clamps, for urging the secured and supported substrate against the clamping surface of the clamping means; positioning the chuck on a leveling device;

moving the chuck to the desired position for exposure or ablation; and repeating the above steps until the exposure or ablation is completed and the substrate made.

In an additional aspect of the invention microelectronic substrates or other electronic components are provided which have been made using the reference chuck and method of the invention as described hereinabove.

BRIEF DESCRIPTION OF THE DRAWINGS

The features of the invention are believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1–5 of the drawings in which like numerals refer to like features of the invention.

Figure 1:
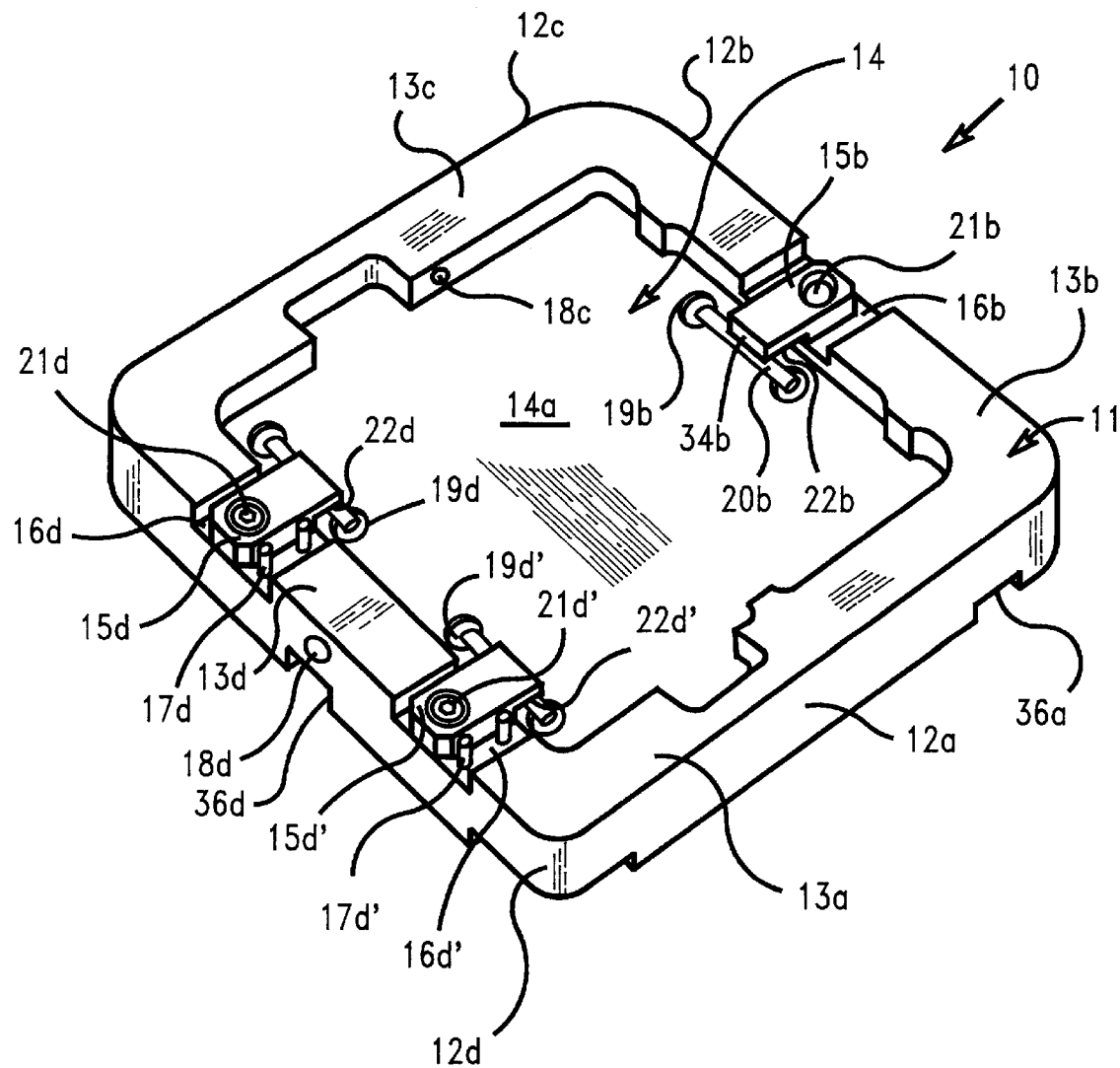
FIG. 1 is a perspective view of a reference chuck of the invention.

Referring to FIG. 1, a reference chuck generally shown as 10 comprises a frame body 11 having sides 12a, 12b, 12c and 12d. The frame body 11 is shown as substantially square and has a square central recess area 14. The frame body may be any shape necessary to hold the desired substrate to be laser ablated or otherwise treated and is typically made of aluminum and/or stainless steel. Teflon impregnated aluminum is preferred. The frame body 11 has peripheral walls 13a, 13b, 13c and 13d defining central recess area 14. The recess area 14 has an upper surface 14a and a lower surface 14b (not shown). The lower surface 14b is planar and extremely flat. Preferably, the lower surface 14b is three point surface contact planar and may be established by using three area recesses in the lower part of the frame body. As shown in FIG. 1, recessed areas 36d and 36a (together with 36b or 36c not shown) are formed to be flat surfaces on which the three leveling pads of the leveling device are positioned. This establishes in effect a flat, planar lower chuck surface 14b.

The reference chuck 10 is shown having three clamps 15b, 15d and 15d' which are positioned in wall recesses with clamp 15b being positioned on wall recess surface 16b, clamp 15d being positioned on wall recess surface 16d and clamp 15d' being positioned on wall recess surface 16d'. Additional clamps may be used for certain applications. The clamps are typically made of hard coated, (e.g., TiN) hardened steel. The wall recess surfaces 16b, 16d and 16d' form a plane which is parallel with the plane formed by the three recessed areas 36a, 36d and 36c or 36b of lower chuck surface 14b. Thus, when the chuck is resting on the leveling device pads (usually three), the lower surface 14b of the chuck is in a parallel plane with the plane formed by the wall recess surfaces 16b, 16d and 16d'.

Clamp registration pins 17d and 17d' are shown abutting the edge of clamps 15d and 15d' respectively. The pins are employed to prevent the tightened clamps from turning and to hold the clamps in the desired clamping position versus the substrate mounted in recess area 14 on recess surface 14a.

Registration pins or set screws 18c and 18d are used to align and secure the substrate in recess 14.

Openings 19b, 19d and 19d' are provided in the frame body to support resilient means or elastomeric seats 20b, 20d and 20d' (20d and 20d' not shown). The openings 19b, 19d and 19d' and elastomer seat 20b are shown as elongated but any suitable opening and elastomeric seat size may be employed which will effectively urge the top surface of a mounted substrate against the underside 22b, 22d and 22d' of clamps 15b, 15d and 15d' respectively. The resilient means or elastomeric seats may be any suitable material as noted above with nitrile being preferred.

The clamps 15b, 15d and 15d' are secured to the frame body 11 by clamp fasteners 21b, 21d and 21d', respectively. The clamp fasteners are typically bolts which are threaded into a threaded opening in the frame body 11 to tighten the clamp to the frame body. The clamps are shown having a protruding edge 34b (only 34b shown) overhanging the recess area 14 with the underside of the clamp edge designated as 22b, 22d and 22d'. The clamp undersides (termed the "clamping surface") contact the substrate when the substrate is mounted and secured in the chuck.

Figure 2:
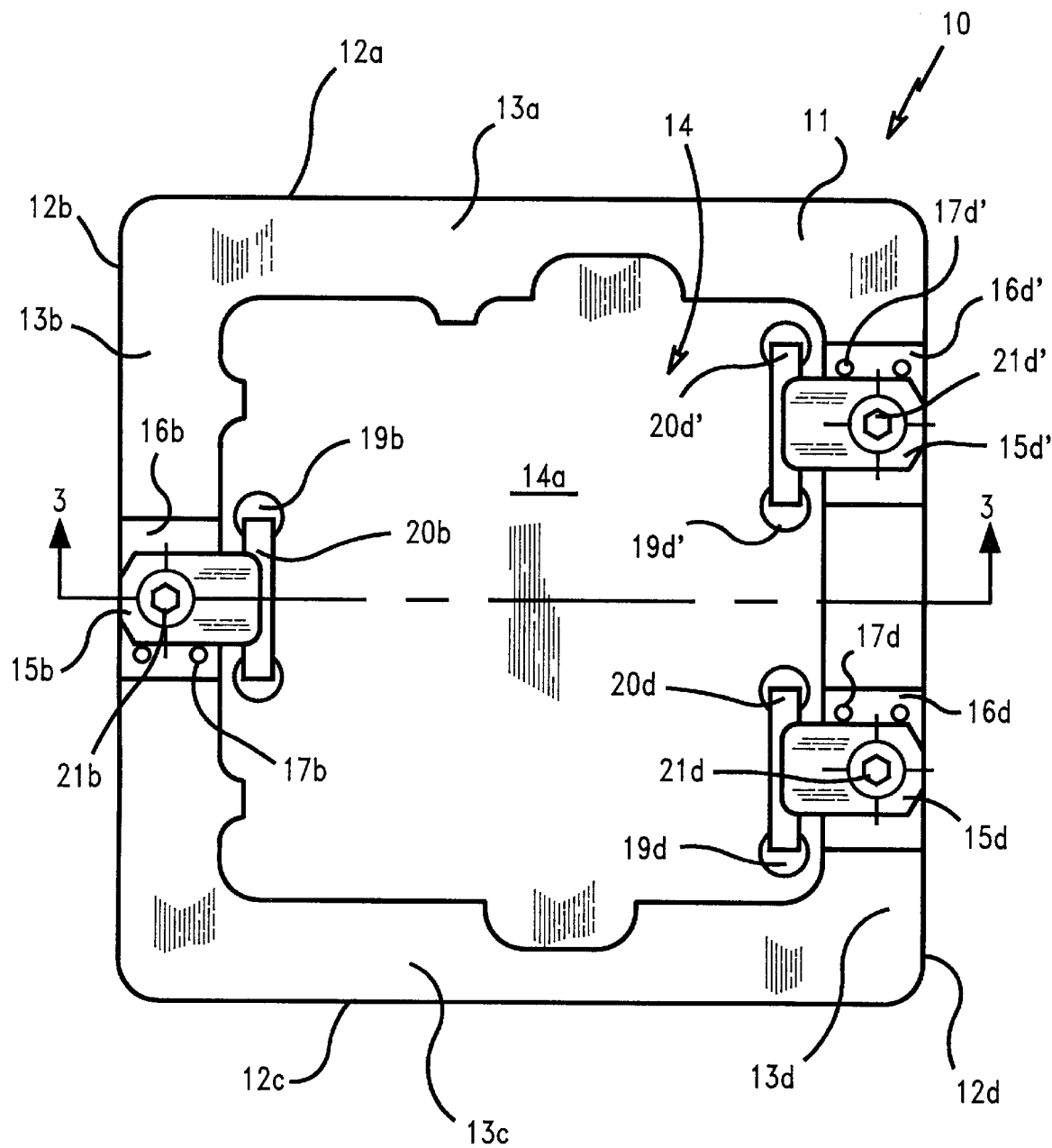
FIG. 2 is a top plan view of the reference chuck of the invention as shown in FIG. 1.

FIG. 2 is a top plan view of the chuck 10 shown in FIG. 1.

Figure 3:
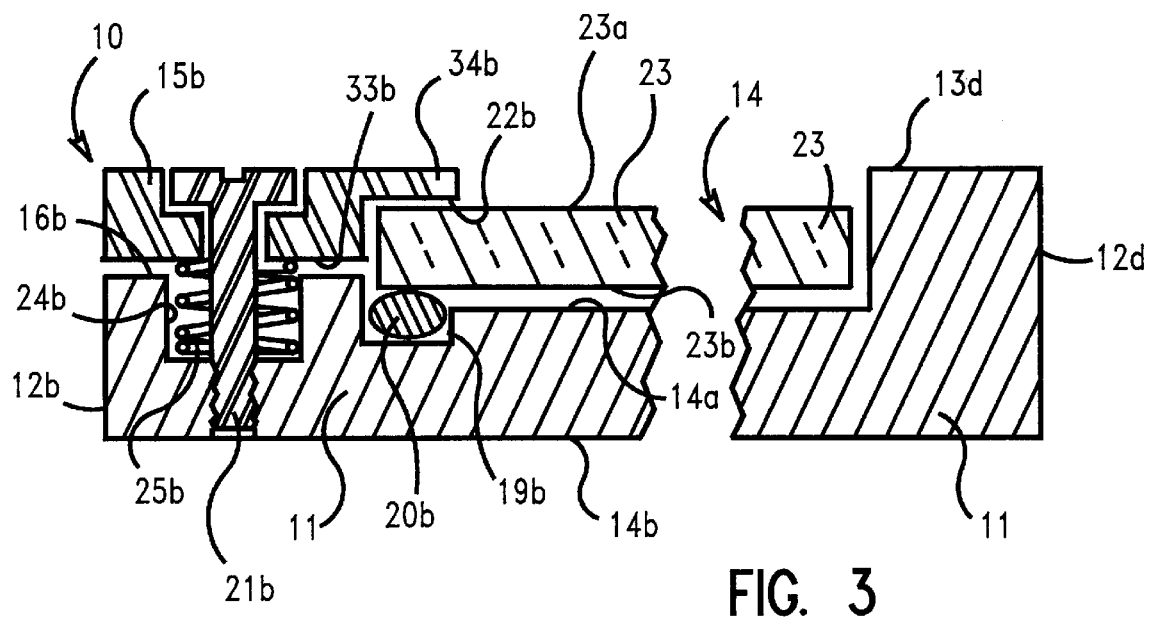
FIG. 3 is a cross-sectional view of the reference chuck of FIG. 2 taken along lines 3—3.

FIG. 3 is an enlarged cross-sectional view of chuck 10 shown in FIG. 2 taken along lines 3—3 of FIG. 2. Frame body 11 is shown having a lower surface 14b and upper surface 14a which defines recess 14. The frame body 11 is shown terminating at recess surface 16b which is the surface to which clamp 15b is secured. Opening 19b in frame body 11 is shown holding elastomer seat 20b in a compressed form. Threaded opening 24b aligns with an opening in the clamp and clamp fastener 21b is used to secure the clamp to the frame body 11. Clamp 15b has a protrusion 34b overhanging recess area 14, with the protrusion having an underside 22b. A substrate 23 mounted on the upper surface 14a of recess 14 contacts the clamp overhang underside 22b of clamp 15b when the clamps are tightened. The elastomeric material urges the upper surface 23a of the substrate to contact the clamp overhang underside 22b. Side 12d and wall 13d show the opposed side of the frame body.

It is an important feature of the invention that the underside 22 of the clamps 15 in the fastened position form a parallel plane with the established three point plane of the lower side 14b of the chuck. Referring to FIG. 3, underside 22b of clamp 15b in the fastened positioned with clamp 15d and 15d' form a parallel plane with the lower three point surface 14b of frame body 11. The three point surface 14b is established by recesses 36d, 36a and 36b or 36c of FIG. 1. When these two surfaces are in parallel planes, substrate 23 (and upper surface 23a) are in parallel planes with the leveling device and the leveling device may be effectively and efficiently used to position the substrate for exposure. Preferably, clamping surfaces 16b, 16d and 16d' and the lower clamp sides 33b, 33d and 33d' of clamps 15b, 15d and 15d', respectively, form parallel planes with the planes of lower surface 14b of chuck 10 and clamping surfaces 22.

Figure 4:
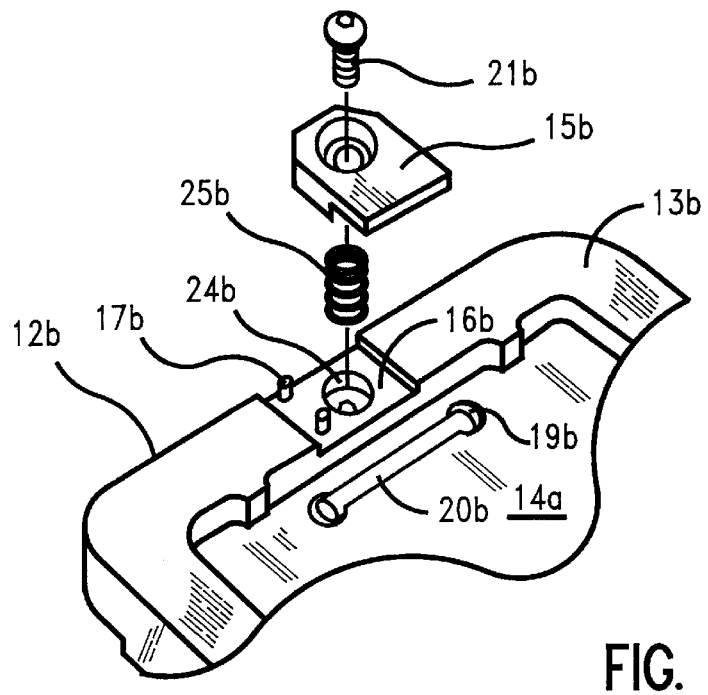
FIG. 4 is an exploded perspective view of a section of a reference chuck of the invention showing in detail the spring clamp mechanism used with the reference chuck.

Referring to FIG. 4, an exploded view of clamp assembly 15b is shown. Accordingly, clamping surface 16b of frame body 11 has an opening 24b therein. The opening supports spring 25b and when clamp 15b is assembled to frame body 11 the clamp compresses spring 25b and clamp 15b is secured by clamp fastener 21b. Registration pins 17b maintain clamp 15b in the fastened position and prevent clamp 15b from turning and affecting the substrate position in the chuck.

Figure 5:
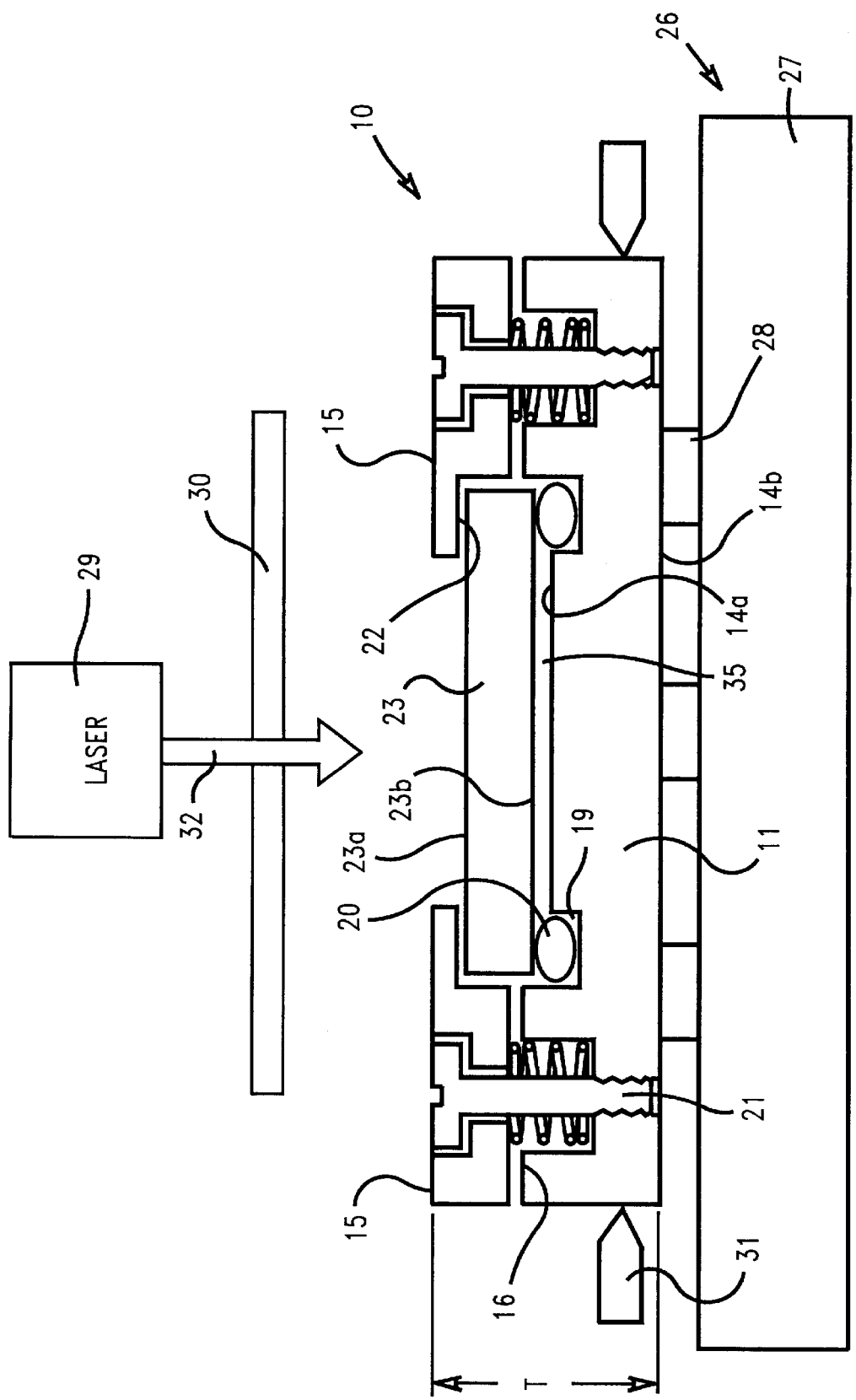
FIG. 5 is a schematic of a reference chuck of the invention having a wafer mounted thereon which reference chuck is positioned on a leveling device used to laser ablate the wafer.

FIG. 5 shows reference chuck 10 having a mounted substrate 23 and being used with a leveling system shown generally as 26 to expose the substrate. The leveling system 26 comprises a base 27 which has three leveling pads 28 on the upper surface thereof. The lower three point planar surface 14b of reference chuck 10 preferably as formed by recesses 36d, 36a and 36b or 36c is positioned on the leveling pads 28 and secured to the leveling system by jaws 31. A laser beam apparatus 29 emits a laser beam 32 through mask 30 which laser beam impinges on the surface of substrate 23 exposing a pattern for making the substrate. Substrate 23 is shown being secured in reference chuck 10 by the urging action of elastomers 20 on the underside 23b of substrate 23 which upper surface 23a is held against the underside 22 of clamp 15. The height of the reference chuck 10 including the mounted substrate 23 is shown as T. This distance is typically 12 mm or less and because of the relatively heavy weight of the substrates, the use of an elastomer seat as the resilient means was preferable due to its high resiliency to size ratio and its ability to support the substrate weight while still applying the necessary compressive force. Elastomers are also non-abrasive to the substrate. It is also highly preferred that there be a gap 35 between the upper surface 14a of frame body 11 and the lower surface 23b of substrate 23 to provide the parallel planar surfaces and enhanced operational results.

Referring to FIG. 5, the method of the invention may be described. Accordingly, clamp fasteners 21 would be unscrewed and clamps 15 moved upwards and sideways typically 90° opening up recess area 14 in which the substrate 23 will be mounted. The mounted substrate is then banked into a corner with set screws 18 (not shown) and the clamps 15 are returned to the clamping position and tightened with fasteners 21 to move the clamps vertically downward toward and against the upper surface 23a of substrate 23. The clamped substrate compresses the elastomer 20 and the compressed elastomer 20 urges the substrate upward against the undersides 22 of clamps 15. The plane of upper surface 23a of the substrate 23 is now precisely parallel to the plane of lower three point surface 14b of chuck 10 because the plane formed by the undersides 22 of clamps 15 and the lower three point surface 14b of chuck 10 are in parallel planes.

The above description was primarily directed to the use of a three point reference plane to establish a planar surface and the use of a three pad leveling device to level the substrate. It will be apparent to those skilled in the art however, that the invention is directed to utilizing a chuck having a planar lower surface which is rested on the leveling device and secured thereto. The substrate mating surfaces of the clamping means (clamping surfaces) form a plane which is parallel with the plane of the lower surface of the chuck and establishes an upper substrate surface which is level when the clamps are tightened to the chuck and secure the substrate.

In the preferred embodiment, three recesses are formed in the lower portion of the frame body which are three point planar and which recesses rest on the leveling pads of the leveling tool. Recesses are formed on the upper portion of the frame body to which clamps are mated and secured. The clamping surfaces of the clamps which secure the substrate to the frame body form a clamping plane which plane is parallel to the lower planar surface of the frame body. The resulting reference chuck when used with a leveling device provides an efficient manufacturing process for making microelectronic substrates requiring leveling operations to ablate or expose the substrate.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A top surface reference chuck for securing a substrate with an upper surface to be exposed or ablated in a lithography or ablation process comprising:

a frame body for supporting the substrate to be exposed or ablated;

the frame body having a lower planar surface which is positioned on a leveling device;

a plurality of movable clamping means, each with an underside surface, at the periphery of the frame body for securing the substrate to the frame body wherein the underside surfaces of the clamping means mate with the upper surface of the substrate such that when the clamping means are tightened, the underside surfaces of the clamping means form a clamping plane, the clamping plane being parallel with the lower planer surface of the frame body; and resilient means provided in the frame body, underneath the clamping means, for urging the supported substrate against the underside surface of the clamping means.

2. The reference chuck of claim 1 wherein the frame body has a central recess area to support the substrate therein.

3. The reference chuck of claim 2 wherein the frame body comprises registration means for positioning the supported substrate in the recess of the frame body.

4. The reference chuck of claim 3 wherein the frame body is rectangular.

5. The reference chuck of claim 4 wherein the frame body is square and the recess area is square.

6. The reference chuck of claim 5 wherein the registration means are on at least two sides of the frame body.

7. The reference chuck of claim 6 wherein the resilient means is an elastomeric material.

8. The reference chuck of claim 7 wherein the clamping means is rotatable to allow top mounting of the substrate in the recess of the frame body.

9. The reference chuck of claim 8 wherein the clamping means has clamping registration means to prevent turning of the clamping means when the clamping means are tightened to secure the substrate.

10. A top surface reference chuck for securing a substrate with an upper surface to be exposed or ablated in a lithography or ablation process comprising:

a frame body for supporting the substrate to be exposed or ablated;

the frame body having a periphery, and a lower planar surface which is positioned on a leveling device;

a plurality of movable clamping means, each with an underside surface, at the periphery of the frame body for securing the substrate to the frame body, wherein the underside surfaces of the clamping means mate with the upper surface of the substrate such that when the clamping means are tightened, the underside surfaces of the clamping means form a clamping plane, the clamping plane being parallel with the lower planer surface of the frame body; and a plurality of elastomeric material seats provided in the frame body for urging the supported substrate against the underside surface of the clamping means.

* * * * *